(12) United States Patent
Lee et al.

(10) Patent No.: US 10,886,493 B2
(45) Date of Patent: Jan. 5, 2021

(54) DISPLAY DEVICE INCLUDING A CRACK DETECTION LINE

(71) Applicant: SAMSUNG DISPLAY CO., LTD., Yongin-si (KR)

(72) Inventors: Keun Soo Lee, Cheonan-si (KR); Neung Ho Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/505,116

(22) Filed: Jul. 8, 2019

(65) Prior Publication Data
US 2019/0341572 A1 Nov. 7, 2019

Related U.S. Application Data

(63) Continuation of application No. 15/457,066, filed on Mar. 13, 2017, now Pat. No. 10,347,860.

(30) Foreign Application Priority Data

Mar. 14, 2016 (KR) .................. 10-2016-0030417

(51) Int. Cl.
| | | |
|---|---|---|
| *H01L 51/52* | (2006.01) | |
| *H01L 27/32* | (2006.01) | |
| *H01L 27/12* | (2006.01) | |

(52) U.S. Cl.
CPC .......... *H01L 51/52* (2013.01); *H01L 27/3211* (2013.01); *H01L 27/3244* (2013.01);
(Continued)

(58) Field of Classification Search
CPC ........... H01L 2251/5338; H01L 27/124; H01L 27/1218; H01L 51/5253; H01L 22/32;
(Continued)

(56) References Cited

U.S. PATENT DOCUMENTS

| 8,053,293 B2 | 11/2011 | Kim et al. |
|---|---|---|
| 2008/0191213 A1 | 8/2008 | Bae et al. |

(Continued)

FOREIGN PATENT DOCUMENTS

| JP | 2013-011663 | 1/2013 |
|---|---|---|
| JP | 2014-122974 | 7/2014 |
| KR | 10-2007-0082867 | 8/2007 |

*Primary Examiner* — Caridad Everhart
(74) *Attorney, Agent, or Firm* — F. Chau & Associates, LLC

(57) ABSTRACT

A display device includes a substrate including a display area and a non-display area. The display device further includes a plurality of pixels in the display area of the substrate. The display device additionally includes a plurality of gate lines and a plurality of data lines respectively connected to the plurality of pixels. The display device further includes a plurality of insulative step portions disposed in the non-display area of the substrate and arranged in a first direction parallel to sides of the display area. The display device further includes a crack detection line in the non-display area and extending primarily in the first direction. The crack detection line includes a first portion which does not overlap the plurality of insulative step portions, and a second portion overlapping each of the insulative step portions.

22 Claims, 9 Drawing Sheets

(52) U.S. Cl.
CPC ...... *H01L 27/3276* (2013.01); *H01L 51/5253* (2013.01); *H01L 27/124* (2013.01); *H01L 27/1218* (2013.01); *H01L 2251/5338* (2013.01)

(58) Field of Classification Search
CPC . H01L 27/3223; H01L 51/52; H01L 51/5246; H01L 2251/5392
See application file for complete search history.

(56) References Cited

U.S. PATENT DOCUMENTS

| | | |
|---|---|---|
| 2010/0134137 A1 | 6/2010 | Kida |
| 2014/0176844 A1 | 6/2014 | Yanagisawa |
| 2014/0197825 A1 | 7/2014 | Thegel et al. |
| 2014/0217397 A1* | 8/2014 | Kwak ................ H01L 27/1218 257/43 |
| 2015/0301636 A1* | 10/2015 | Akimoto ................ G06F 3/044 345/173 |
| 2016/0293078 A1 | 10/2016 | Byun |
| 2016/0293884 A1* | 10/2016 | Zhang ................ H05B 33/0896 |
| 2017/0179210 A1* | 6/2017 | Kimura ............... H01L 51/0097 |
| 2017/0263880 A1 | 9/2017 | Lee et al. |

* cited by examiner

DISPLAY DEVICE INCLUDING A CRACK DETECTION LINE

CROSS-REFERENCE TO RELATED APPLICATIONS

This application is a continuation of U.S. patent application Ser. No. 15/457,066 filed Mar. 13, 2017, which claims priority under 35 USC § 119 to Korean Patent Application No. 10-2016-0030417 filed on Mar. 14, 2016 in the Korean Intellectual Property Office, the disclosures of which are incorporated by reference herein in their entireties.

TECHNICAL FIELD

The present disclosure relates to a display device, and more particularly, to a display device including a crack detection line.

DISCUSSION OF THE RELATED ART

Currently, portable display devices are being developed so that they are flexible instead of being rigid. As portable display devices are further developed, the display device may be changed from a flat form to a flexible form.

When a crack is generated during a manufacturing process of the display device, moisture and the like may permeate into a display area of the display device. The permeation of moisture and the like through the crack may cause a defect in the display device.

SUMMARY

According to an exemplary embodiment of the present disclosure, a display device includes a substrate including a display area and a non-display area. The display device further includes a plurality of pixels in the display area of the substrate. The display device additionally includes a plurality of gate lines and a plurality of data lines respectively connected to the plurality of pixels. The display device further includes a plurality of insulative step portions disposed in the non-display area of the substrate and arranged in a first direction repeatedly to sides of the display area. The display device further includes a crack detection line in the non-display area and extending primarily in the first direction. The crack detection line includes a first portion which does not overlap the plurality of insulative step portions, and a second portion overlapping each of the insulative step portions.

In an exemplary embodiment of the present invention, the first portion and the second portion of the crack detection line are at different heights from each other.

In an exemplary embodiment of the present invention, the second portion of the crack detection line is on a surface of an upper portion of an insulative step portion of the plurality of insulative step portions, and the first portion of the crack detection line is at substantially the same height as that of a lower portion of the insulative step portion of the plurality of insulative step portions.

In an exemplary embodiment of the present invention, the crack detection line is connected to at least one data line of the plurality of data lines.

In an exemplary embodiment of the present invention, the crack detection line at least partially surrounds the display area of the substrate.

In an exemplary embodiment of the present invention, the plurality of insulative step portions includes an organic material or an inorganic material, and at least partially surrounds the display area of the substrate.

In an exemplary embodiment of the present invention, the second portion is on substantially the same layer as that of the data line, and the crack detection line includes substantially the same material as that of the data line.

In an exemplary embodiment of the present invention, the first portion is directly on the substrate.

In an exemplary embodiment of the present invention, the display device further includes an insulating layer on the substrate. The first portion is on the insulating layer.

In an exemplary embodiment of the present invention, the display device further includes an active layer connected with the data line. The first portion is at substantially the same height as that of the active layer.

In an exemplary embodiment of the present invention, the plurality of insulative step portions have substantially the same form.

In an exemplary embodiment of the present invention, a part of the crack detection line is divided into a first line and a second line.

In an exemplary embodiment of the present invention, a sum of thicknesses of the first line and the second line is equal to or smaller than a thickness of the crack detection line.

According to an exemplary embodiment of the present invention, a display device includes a substrate including a first area and a second area surrounding the first area. The display device further includes a plurality of insulative step portions disposed in the non-display area of the substrate and arranged in a first direction repeatedly to a side of the display area. The display device additionally includes a crack detection line in the second area and extending primarily in the first direction. The crack detection line includes a first portion and a plurality of second portions. The first portion is between each insulative step portion of the plurality of insulative step portions, and the second portion overlaps each of the insulative step portions.

In an exemplary embodiment of the present invention, the first portion is on the substrate, and the first portion and the second portion are at different heights from each other.

In an exemplary embodiment of the present invention, the first portion and the second portion are connected to each other along a lateral wall of each insulative step portion of the plurality of insulative step portions.

In an exemplary embodiment of the present invention, the crack detection line is divided into a plurality of lines, and the plurality of lines recombine near a first end and a second end of the crack detection line.

According to an exemplary embodiment of the present invention, a display device includes a substrate including a display area and a non-display area surrounding the display area. The display device further includes a plurality of insulative step portions disposed in the non-display area and arranged in a first direction parallel to a side of the display with a predetermined interval. The display device additionally includes a crack detection line on the plurality of insulative step portions. The crack detection line includes a first portion and a second portion. The second portion overlaps an upper portion of an insulative step portion of the plurality of insulative step portions and the first portion is adjacent to at least one insulative step portion of the plurality of insulative step portions.

In an exemplary embodiment of the present invention, the first portion and second portion have a curvature.

In an exemplary embodiment of the present invention, the first portion is on the substrate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
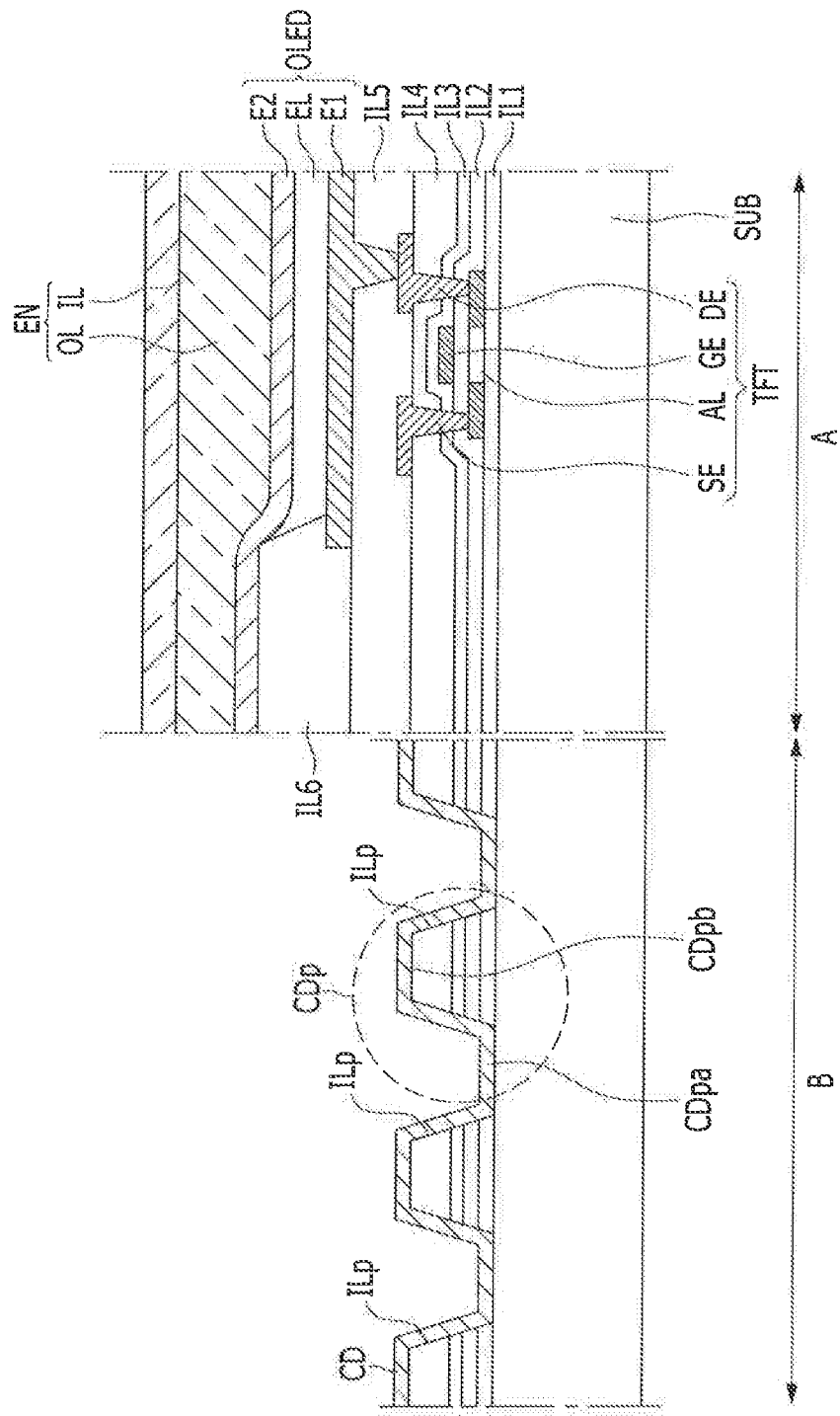
FIG. 1 is a cross-sectional view of a display device according to an exemplary embodiment.

Exemplary embodiments of the present invention will be described in more detail below with reference to the accompanying drawings, in which exemplary embodiments of the preset invention are shown.

In describing the present invention, parts that are not related to the description will be omitted. Like reference numerals may designate like elements throughout the specification and the drawings.

In addition, the size and thickness of each configuration shown in the drawings may be exaggerated for better understanding and ease of description, but the present invention is not limited thereto. In the drawings, the thickness of layers, films, panels, regions, etc., may be exaggerated for clarity.

Further, it will be understood that when an element such as a layer, film, region, or substrate is referred to as being "on" another element, it can be directly on the other element or intervening elements may also be present.

Further, when an element is referred to as being "above" or "on" a part serving as a reference, the element may be positioned on or under the reference part, and it does not mean that the element is essentially positioned "above" or "on" in a direction opposite to gravity.

First, a display device according to an exemplary embodiment will be described with reference to FIG. 1. FIG. 1 is a cross-sectional view of a display device according to an exemplary embodiment.

The display device according to the exemplary embodiment includes a display area, which includes a plurality of pixels and displays an image, and a non-display area, in which various wires are positioned and which does not display an image. A first area A of FIG. 1 represents a cross-section of a part of one pixel in the display area of the display device. A second region B of FIG. 1 represents a cross-section of a portion of the non-display area of the display device, through which a crack detection line CD passes, taken along in a direction parallel to an extension direction of the crack detection line CD.

Referring to the first area A of FIG. 1, the display device includes a substrate SUB, and a thin film transistor TFT is positioned on the substrate SUB. The thin film transistor TFT includes an active layer AL, a gate electrode GE, a source electrode SE, and a drain electrode DE. The gate electrode GE is connected to a gate line, and the source electrode SE is connected to a data line.

The active layer AL may be formed of polysilicon or an oxide semiconductor. The active layer AL may include a channel area, which is not doped with impurities. A source area and a drain area, may be positioned at both sides of the channel area and are doped with impurities. A first insulating layer IL1 may be positioned between the substrate SUB and the thin film transistor TFT.

The gate electrode GE is positioned on the active layer AL with a second insulating layer IL2 interposed therebetween. Further, the third insulating layer IL3 may be positioned on the gate electrode GE such that the gate electrode GE is covered. A fourth insulating layer IL4 may be positioned on the third insulating layer IL3. Accordingly, the fourth insulating layer IL4 covers gate electrode GE. The source electrode SE and the drain electrode DE may be positioned on the fourth insulating layer IL4 and may be connected to the source area and the drain area of the active layer AL through respective contact holes formed in the second insulating layer IL2, the third insulating layer IL3, and the fourth insulating layer IL4. The drain electrode DE is connected to a first electrode E1 of an organic light emitting diode OLED through a contact hole formed in a fifth insulating layer IL5. In an exemplary embodiment, the gate electrode may be positioned on the active layer AL. The present invention is not limited thereto. For example, the gate electrode GE may be positioned under the active layer AL.

The organic light emitting diode OLED includes the first electrode E1 connected with the drain electrode DE of the thin film transistor TFT, an organic emission layer EL positioned on the first electrode E1, and a second electrode E2 positioned on the organic emission layer EL. A sixth insulating layer IL6 may be positioned on the first electrode E1 to define a section, in which the organic emission layer EL may be positioned. For example, the sixth insulating layer IL6 may partially cover the first electrode EL1.

The first electrode E1 may be an anode that may be a hole injection electrode, and the second electrode E2 positioned on the organic emission layer EL may be a cathode that may be an electron injection electrode. However, the present invention is not limited thereto. For example, the first electrode E1 may be a cathode that may be an electron injection electrode, and the second electrode E2 positioned on the organic emission layer EL may be an anode that may be a hole injection electrode.

The organic emission layer EL may be positioned between the first electrode E1 and the second electrode E2, and may include a low molecular organic material or a polymer organic material, such as poly 3,4-ethylenedioxythiophene (PEDOT). The organic emission layer EL may include a red organic emission layer for emitting red light, a green organic emission layer for emitting green light, and a blue organic emission layer for emitting blue light. Further, the red organic emission layer, the green organic emission layer, and the blue organic emission layer are formed in a red pixel, a green pixel, and a blue pixel, respectively, to produce an image with color.

An encapsulating unit EN may cover the substrate SUB and may seal the organic light emitting diode OLED interposed therebetween. Further, the encapsulation unit EN may seal the display area. The encapsulating unit EN may include an organic layer OL and an inorganic layer IL positioned on the organic layer OL.

Referring to the second area B of FIG. 1, a plurality of insulative step portions ILp is repeatedly arranged in the non-display area with a predetermined interval in a predetermined direction. The plurality of insulative step portions ILp may have substantially the same form (e.g., shape), or each insulative step portion ILp may have different forms. For example, each insulative step portion ILp may have different heights and/or widths. The plurality of insulative step portions ILp may be disposed in the non-display area so as to surround the display area. The plurality of insulative step portions ILp may provide a step portion to the crack detection line CD to be described below. For example, the crack detection line CD may be disposed on insulative step portions ILp and between each insulative step portion ILp. The plurality of insulative step portions ILp may include an organic material or an inorganic material. The plurality of insulative step portions ILp may include at least a part of the sequentially disposed first to fourth insulating layers IL1, IL2, IL3, and IL4.

The crack detection line CD may extend in a direction in which the plurality of insulative step portions ILp may be repeatedly disposed. Further, the crack detection line CD may be positioned on the plurality of insulative step portions ILp. The direction, in which the plurality of insulative step portions ILp may be repeatedly disposed, corresponds to the extension direction of the crack detection line CD. The extension direction of the crack detection line CD means a direction of a long side, not a direction of a short side, of the crack detection line CD. The crack detection line CD may be disposed on the plurality of insulative step portions ILp so as to at least partially surround the display area.

The crack detection line CD includes a plurality of stepped wiring units CDp, which may be repeatedly positioned in the extension direction of the crack detection line CD. The stepped wiring unit CDp includes a first portion CDpa, which does not overlap the insulative step portion ILp, and a second portion CDpb, which overlaps the insulative step portion ILp. The plurality of stepped wiring units CDp may be continuously disposed in the direction, in which the plurality of insulative step portions ILp may be repeatedly disposed. The second portion CDpb of the stepped wiring unit CDp may cover a surface of the insulative step portion ILp that faces a surface of the substrate SUB. The insulative step portion ILp may be positioned under at least a part of the stepped wiring unit CDp.

The stepped wiring unit CDp includes a first portion CDpa having a lower surface positioned at substantially the same height as that of a lower surface of the insulative step portion ILp and a second portion CDpb positioned on an upper surface of the insulative step portion ILp. Further, the first portion CDpa and the second portion CDpb are connected along a lateral wall of the insulative step portion ILp. For example, the second portion CDpb overlaps the insulative step portion ILp, and the first portion CDpa does not overlap the insulative step portion ILp. Accordingly, the first portion CDpa and the second portion CDpb have a height difference corresponding to a height of the insulative step portion ILp. Here, the height is based on a direction vertical to a surface, on which the insulative step portions ILp may be disposed, of the substrate SUB. For example, the surface of substrate SUB, of which the height is based on, may be a top surface of the substrate SUB.

As described above, the crack detection line CD has a form, in which the second portion CDpb and the first portion CDpa having the height difference corresponding to the height of the insulative step portion ILp are repeated in the extension direction of the crack detection line CD. For example, the second portion CDpb of the crack detection line CD may be positioned on substantially the same layer as that of the data line and the source electrode SE, and the first portion CDpa of the crack detection line CD may be positioned on the substrate SUB. However, the first portion CDpa of the crack detection line CD may be positioned on the first insulating layer IL1 positioned on the substrate SUB. The crack detection line CD may include the same material as that of the data line and the source electrode SE.

Figure 2:
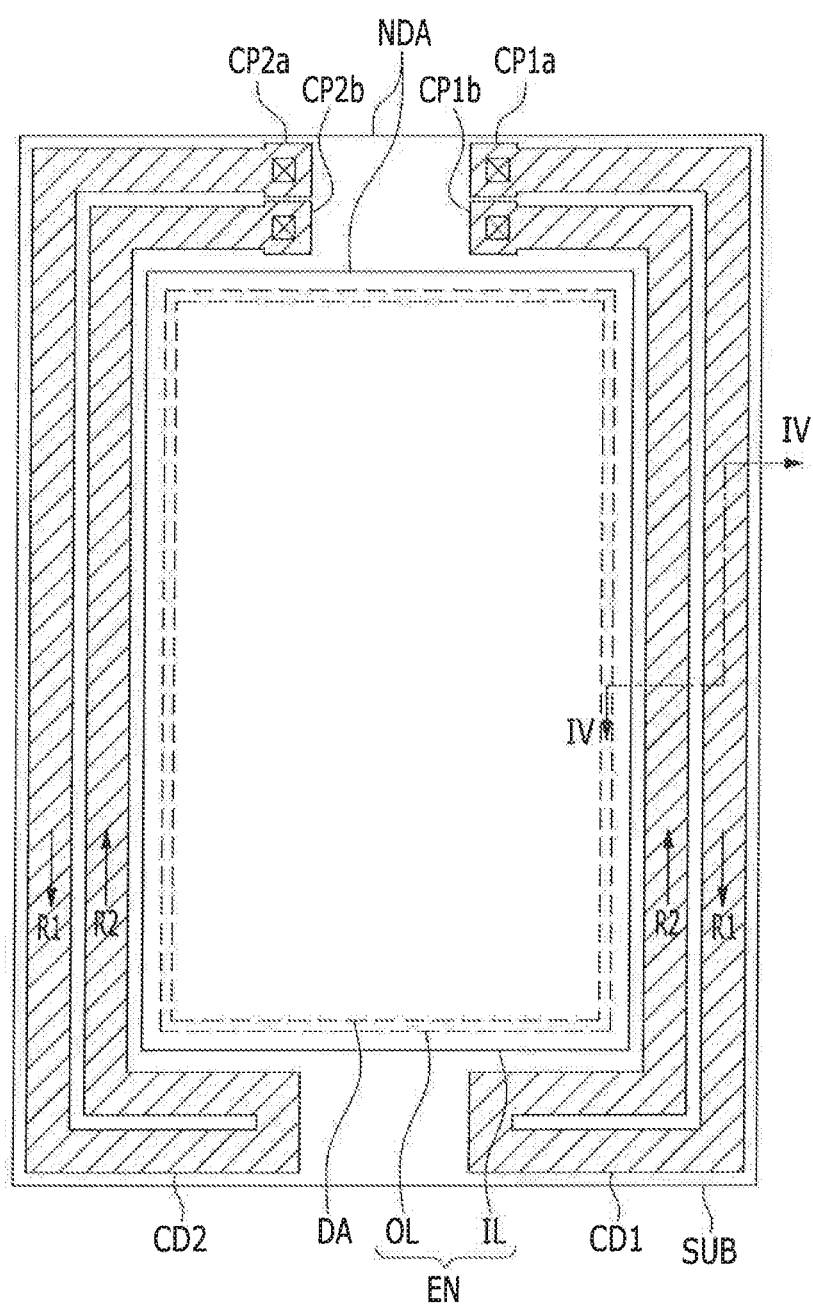
FIG. 2 is a top plan view schematically illustrating a disposition of a crack detection line in a display device according to an exemplary embodiment.
Figure 3:
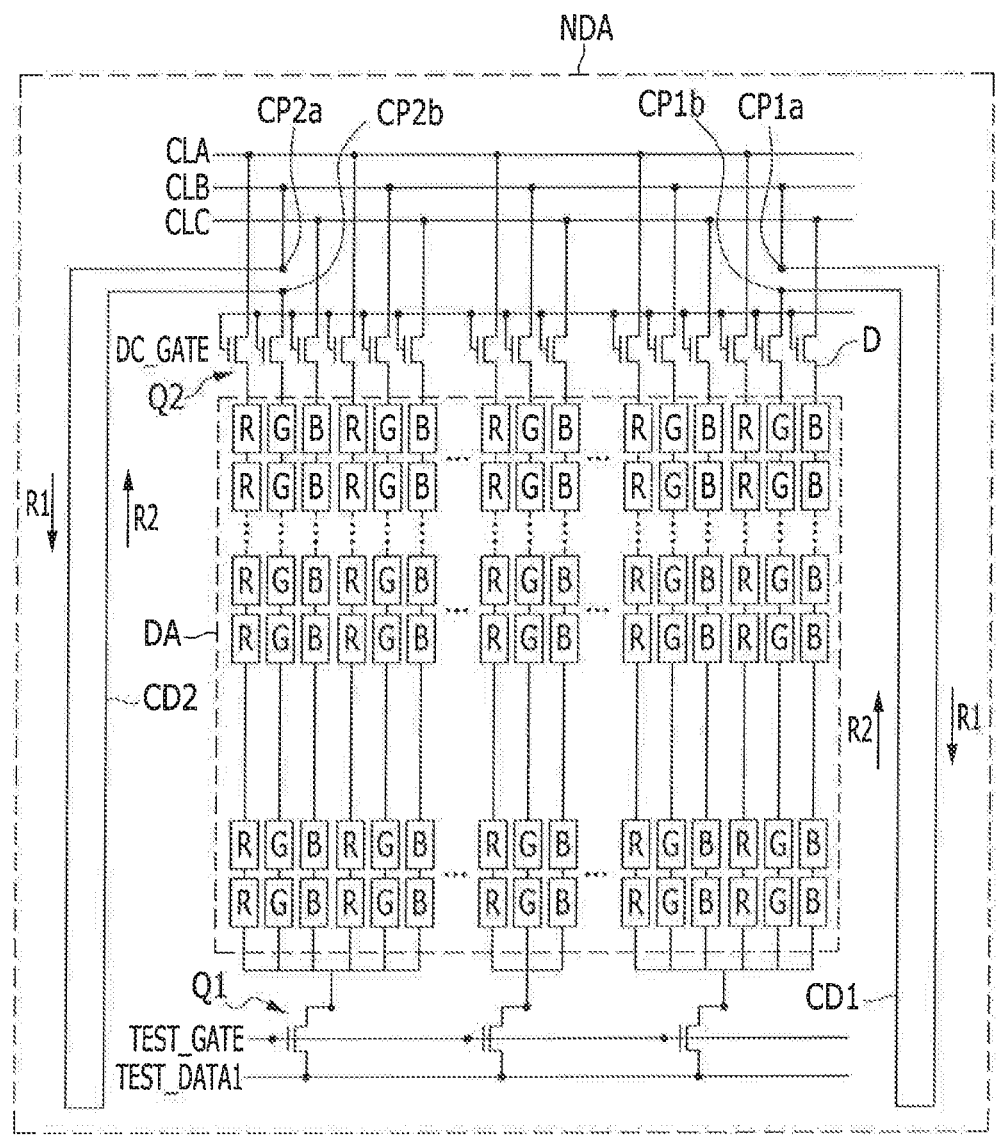
FIG. 3 is a layout view of the display device according to an exemplary embodiment.
Figure 4:
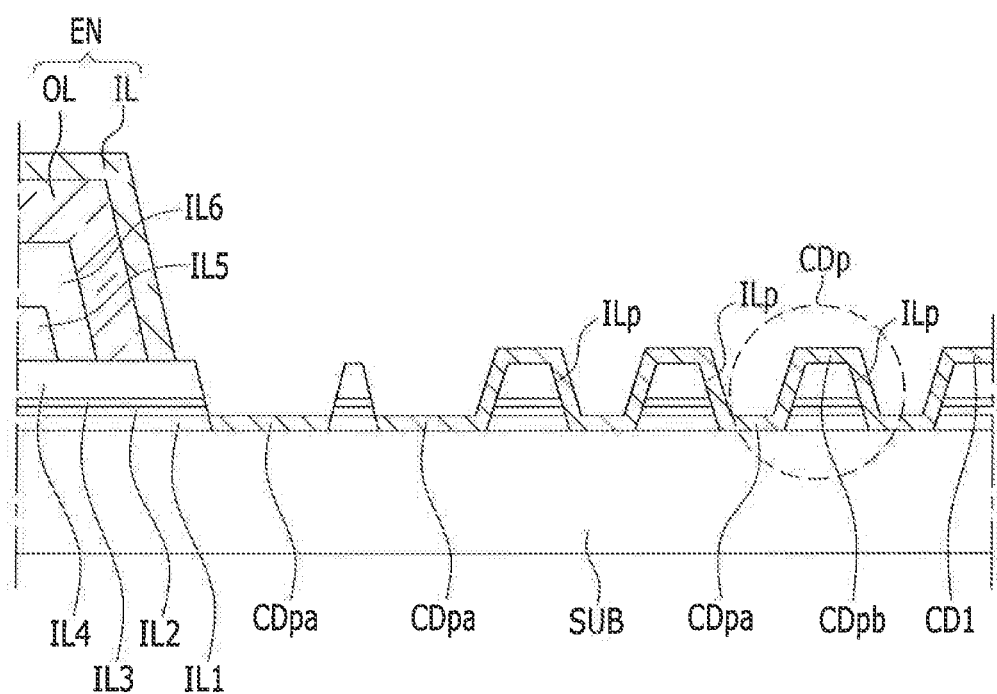
FIG. 4 is a cross-sectional view taken along line IV-IV of FIG. 2.

Hereinafter, a display device according to an exemplary embodiment will be described in detail based on a crack detection line with reference to FIGS. 2 to 4. FIG. 2 is a top plan view schematically illustrating a disposition of a crack detection line in a display device according to an exemplary embodiment. FIG. 3 is a layout view of the display device according to an exemplary embodiment, and FIG. 4 is a cross-sectional view taken along line IV-IV of FIG. 2.

The substrate SUB of the display device according to an exemplary embodiment may be an insulative substrate made of, for example, glass, polymer, or stainless steel. The substrate SUB may be flexible, stretchable, foldable, bendable, rollable, etc. For example, the substrate SUB may have a flexible film form including a resin, such as polyimide.

The substrate SUB includes a display area DA for displaying an image and a non-display area NDA positioned in a border region around of the display area DA (e.g., a peripheral area of the display area). In an exemplary embodiment, the non-display area NDA is positioned so as to surround the display area DA, but according to an exemplary embodiment, the non-display area NDA may be positioned along one side, two sides, or three sides of the display area DA.

The display area DA of the substrate SUB includes a plurality of pixels R, G, and B. The pixel is a minimum unit for displaying an image.

An encapsulating unit EN may be positioned on the substrate SUB overlapping the entirety of the display area DA and the non-display area NDA of the substrate SUB. The encapsulating unit EN covers the substrate SUB with the plurality of pixels R, G, and B interposed therebetween and seals the display area DA. The encapsulating unit EN may include an organic layer OL and an inorganic layer IL positioned on the organic layer OL. The encapsulating unit EN may be a thin film encapsulating unit. According to an exemplary embodiment, the encapsulating unit EN may include one or more organic layers and one or more inorganic layers, which may be alternately disposed. However, the present invention is not limited thereto, and the number of inorganic layers or organic layers may be, for example, two or more, and the plurality of inorganic layers and the plurality of organic layers may be alternately disposed. For example, the encapsulating unit EN may be a multi-layered structure. Further, the multi-layered structure may include one or more sandwich structures, in which one or more organic layers may be inserted between two or more inorganic layers.

The display device according to an exemplary embodiment may include a plurality of signal lines connected to the plurality of pixels R, G, and B. At least a part of the plurality of signal lines is positioned in the non-display area NDA of the substrate.

The plurality of signal lines may include a first test gate line TEST_GATE, a second test gate line DC_GATE, a plurality of data lines D, a first test signal line TEST_DATA1, a plurality of second data signal lines CLA, CLB, and CLC, a first crack detection line CD1, and a second crack detection line CD2.

A control terminal of a first switching element Q1 positioned in the non-display area NDA of the substrate is connected to the first test gate line TEST_GATE, and an input terminal thereof is connected to the first test signal line TEST_DATA1. Further, an output terminal of the first switching element Q1 is connected to the data line D. The output terminal of the first switching element Q1 may be connected to the plurality of data lines D.

A control terminal of a second switching element Q2 is connected to the second test gate line DC_GATE, and an input terminal thereof is connected to one of the second test signal lines CLA, CLB, and CLC. Further, an output terminal of the second switching element Q2 is connected to the data line D. A first pixel R among the plurality of pixels R, G, and B may be connected to a second-one test signal line CLA through the second switching element Q2. The second pixel G may be connected to a second-two test signal line CLB through the second switching element Q2, and a third pixel B may be connected to a second-three test signal line CLC through the second switching element Q2.

The first crack detection line CD1 and the second crack detection line CD2 may be disposed at both sides (e.g., left and right) of the display area DA, respectively, so as to at least partially surround the display area DA, in which the plurality of pixels R, G, and B is positioned.

The first crack detection line CD1 may be connected to at least one of the plurality of data lines D through a first connection portion CP1a and a second connection portion CP1b. The data line D connected with the first crack detection line CD1 may be connected to the second-two test signal line CLB. One end of the first crack detection line CD1 may be connected to the input terminal of the second switching element Q2 through the second connection portion CP1b.

The first crack detection line CD1 extends in a first direction R1 from the first connection portion CP1a along the non-display area NDA adjacent to the border of the display area DA, in which the plurality of pixels R, G, and B is formed, and then changes a direction and is extended in a second direction R2 that is an opposite direction to the first direction R1. Further, the first crack detection line CD1 is connected with another wire through the second connection portion CP1b.

Similarly, the second crack detection line CD2 is connected to at least one of the plurality of data lines D through a third connection portion CP2a and a fourth connection portion CP2b. The data line D connected with the second crack detection line CD2 may be connected to the second-two test signal line CLB. One end of the second crack detection line CD2 may be connected to the input terminal of the second switching element Q2 through the fourth connection portion CP2b.

The second crack detection line CD2 extends in the first direction R1 from the third connection portion CP2a along the non-display area NDA adjacent to the border of the display area DA, in which the plurality of pixels R, G, and B is formed, and then changes a direction and is extended in the second direction R2 that is the opposite direction to the first direction R1. Further, the second crack detection line CD2 is connected with another wire through the fourth connection portion CP2b.

The first crack detection line CD1 and the second crack detection line CD2 may extend in the first direction R1 so as to at least partially surround the display area DA and then return along the second direction R2 that is the opposite direction to the first direction R1. For example, the first direction R1 may extend parallel to sides of the display area DA.

The first crack detection line CD1 includes a plurality of repeatedly positioned stepped wiring units CDp. The stepped wiring unit CDp includes a first portion CDpa and a second portion CDpb having different heights from each other based on a direction vertical to the top surface of the substrate SUB. The first crack detection line CD1 may have a form, in which the first portion CDpa and the second portion CDpb are repeatedly present in an extension direction of the first crack detection line CD1, so that a predetermined height difference is repeated.

The stepped wiring unit CDp of the first crack detection line CD1 includes a second portion CDpb of the stepped wiring unit CDp overlapping the insulative stepped portion ILp and a first portion CDpa, which does not overlap the insulative stepped portion ILp. For example, the insulative step portion ILp may be positioned under a part of the stepped wiring unit CDp. The insulative step portion ILp provides a step to the first crack detection line CD1, and a height of a surface of the first crack detection line CD1 is changed according to whether the first crack detection line CD1 overlaps the insulative step portion ILp.

The plurality of insulative step portions ILp is repeatedly disposed in the extension direction of the first crack detection line CD1 with a predetermined interval. The plurality of insulative step portions ILp may have substantially the same form or different forms, such as heights or widths. The plurality of insulative step portions ILp may be disposed so as to surround the display area DA. The plurality of insulative step portions ILp may be made of an organic material or an inorganic material. The plurality of insulative step portions ILp may include at least a part of the sequentially disposed first to fourth insulating layers IL1, IL2, IL3, and IL4.

The second portion CDpb of the stepped wiring unit CDp is positioned on a surface of an upper portion of the insulative step portion ILp, and the first portion CDpa may be positioned at substantially the same height as that of the lower portion of the insulative step portion ILp. For example, the first portion CDpa may be positioned on substantially the same layer as that of the lower portion of the insulative step portion ILp. The first portion CDpa and the second portion CDpb are connected along a lateral wall of the insulative step portion ILp. The first portion CDpa and the second portion CDpb have a height difference corresponding to a height of the insulative step portion ILp. For example, the second portion CDpb overlaps the insulative step portion ILp, and the first portion CDpa does not overlap the insulative step portion ILp. Accordingly, the first crack detection line CD1 has a form, in which the high second portion CDpb and the low first portion CDpa having the height difference corresponding to the height of the insulative step portion ILp are repeated in the extension direction of the first crack detection line CD1.

The second portion CDpb of the first crack detection line CD1 may be positioned on substantially the same layer as that of the data line D, and the first portion CDpa of the first crack detection line CD1 may be positioned on the substrate SUB. However, the first portion CDpa of the crack detection line CD may be positioned on a first insulating layer IL1 positioned on the substrate SUB. The first crack detection line CD1 may include substantially the same material as that of the data line D.

Similarly, the second crack detection line CD2 may also include a stepped wiring unit CDp including the first portion CDpa and the second portion CDpb having a height difference corresponding to the height of the insulative step portion ILp. Further, the forms of the first crack detection line CD1 and the second crack detection line CD2 may be substantially the same as each other.

In the above, the preferable structure of the display device according to an exemplary embodiment of the present invention has been described, but the present invention is not limited thereto, and various modifications may be made within the scope of the inventive concept of the present invention. For example, one end of the first crack detection line CD1 may be connected to an output terminal of the second switching element Q2, and the second crack detection line CD2 may be connected to an output terminal of the second switching element Q2.

Further, the data line D connected with the first crack detection line CD1 and the data line D connected with the second crack detection line CD2 may each be connected with the second-one test signal line CLA or the second-three test signal line CLC, and might not be connected with the second-two test signal line CLB. Further, the first crack detection line CD1 and the second crack detection line CD2 may be connected to the data lines connected to the different test signal lines, respectively.

Further, the insulative step portion ILp may include at least a part of the sequentially disposed second to fourth insulative layers IL2, IL3, and IL4, and thus, may have substantially the same height as that of the sequentially disposed second to fourth insulative layers IL2, IL3, and IL4. Accordingly, the first portion CDpa and the second portion CDpb may have a height difference corresponding to the height of the second to fourth insulative layers IL2, IL3, and IL4 sequentially disposed.

Figure 5:
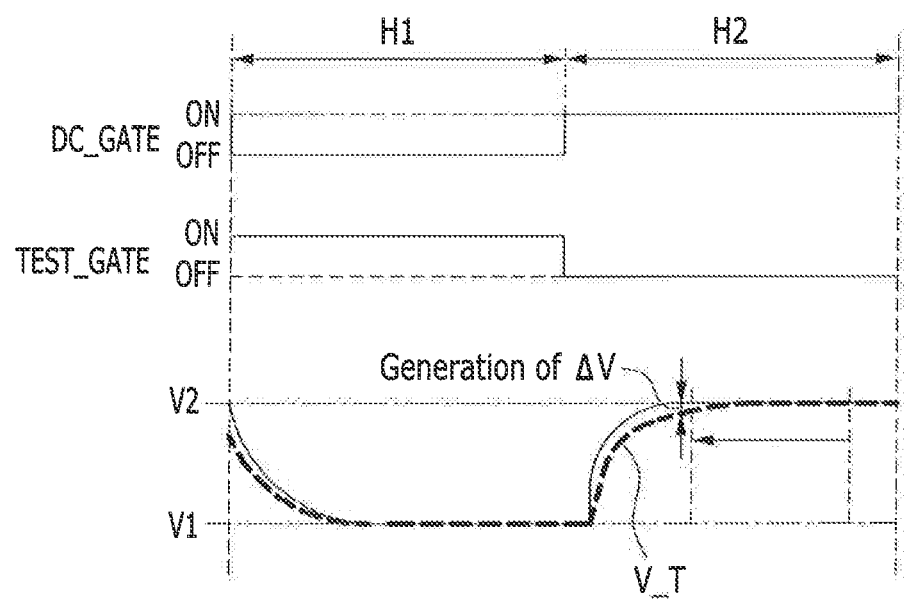
FIG. 5 is a waveform diagram of a signal of the display device according to an exemplary embodiment.

Hereinafter, an operation and an effect of the display device according to an exemplary embodiment of the present invention will be described with reference to FIGS. 3 to 5. FIG. 5 is a waveform diagram of a signal of the display device according to an exemplary embodiment.

When a gate on signal is applied to the first test gate line TEST_GATE for a first time H1, the plurality of first switching elements Q1 connected to the plurality of data lines D is turned on and a first signal V1 applied to a first test signal line TEST_DATA1 is applied to the plurality of data lines D. The first signal V1 may be a signal, by which the plurality of pixels R, G, and B displays white, and the plurality of pixels R, G, and B may display white if the first signal V1 is applied to the plurality of data lines D.

If a gate off signal is applied to the first test gate line TEST_GATE, when the gate on signal is applied to the second test gate line DC_GATE for a second time H2, the second switching element Q2 connected to the plurality of data lines D is turned on, so that a second signal V2 applied to the plurality of second test signal lines CLA, CLB, and CLC is applied to the plurality of data lines D. The second signal V2 may be a signal, by which the plurality of pixels R, G, and B displays black, and the plurality of pixels R, G, and B may display black if the second signal V2 is applied to the plurality of data lines D.

For example, when a crack is generated in the non-display area NDA by applying an external impact or force to the display device, the first crack detection line CD1 and the second crack detection line CD2 may be damaged.

Accordingly, resistance of the data line D connected to the first crack detection line CD1 and resistance of the data line D connected the second crack detection line CD2 may increase, and thus, a voltage V_T applied to the pixel connected to the first crack detection line CD1 and the pixel connected the second crack detection line CD2 may both fail to be charged up to the second signal V2 and may have a voltage difference ΔV with the second signal V2.

The voltage difference ΔV may be generated, so that the pixel connected to the first crack detection line CD1 and the second crack detection line CD2 may fail to display the color black and may illuminate at a relatively high intensity. Based on this voltage difference ΔV, it may be possible to detect a crack generated in the non-display area NDA adjacent to the border of the display area DA.

The step wiring portions CDp included in the first crack detection line CD1 and the second crack detection line CD2 may enable the first crack detection line CD1 and the second crack detection line CD2 to be more susceptible to being damaged by a crack generated in the non-display area NDA, thereby more effectively detecting a crack generated in the non-display area NDA.

In addition, the stepped wiring unit CDp may include the first portion CDpa and the second portion CDpb having the height difference to allow the first crack detection line CD1 and the second crack detection line CD2 to be positioned in a wider area. Compared to the case where the crack detection line has a plane form positioned on substantially the same layer and having substantially the same surface height (e.g., without a step in the crack detection line), the case where the crack detection line has a form having a repeated height difference and the crack detection line is also positioned on the surface and the lateral surface of the insulating layer has an increased probability of detecting a crack generated in the insulating layer.

Further, when a crack is generated in the insulating layer, stress is concentrated to a corner portion of the lateral wall of the insulative step portion ILp, so that a crack and the like may be generated in the first crack detection line CD1 and the second crack detection line CD2 positioned on the corner of the lateral wall of the insulative step portion ILp. Accordingly, when a crack is not directly generated in the first crack detection line CD1 and the second crack detection line CD2, but is generated only in the insulating layer, it is possible to detect the crack.

Figure 7:
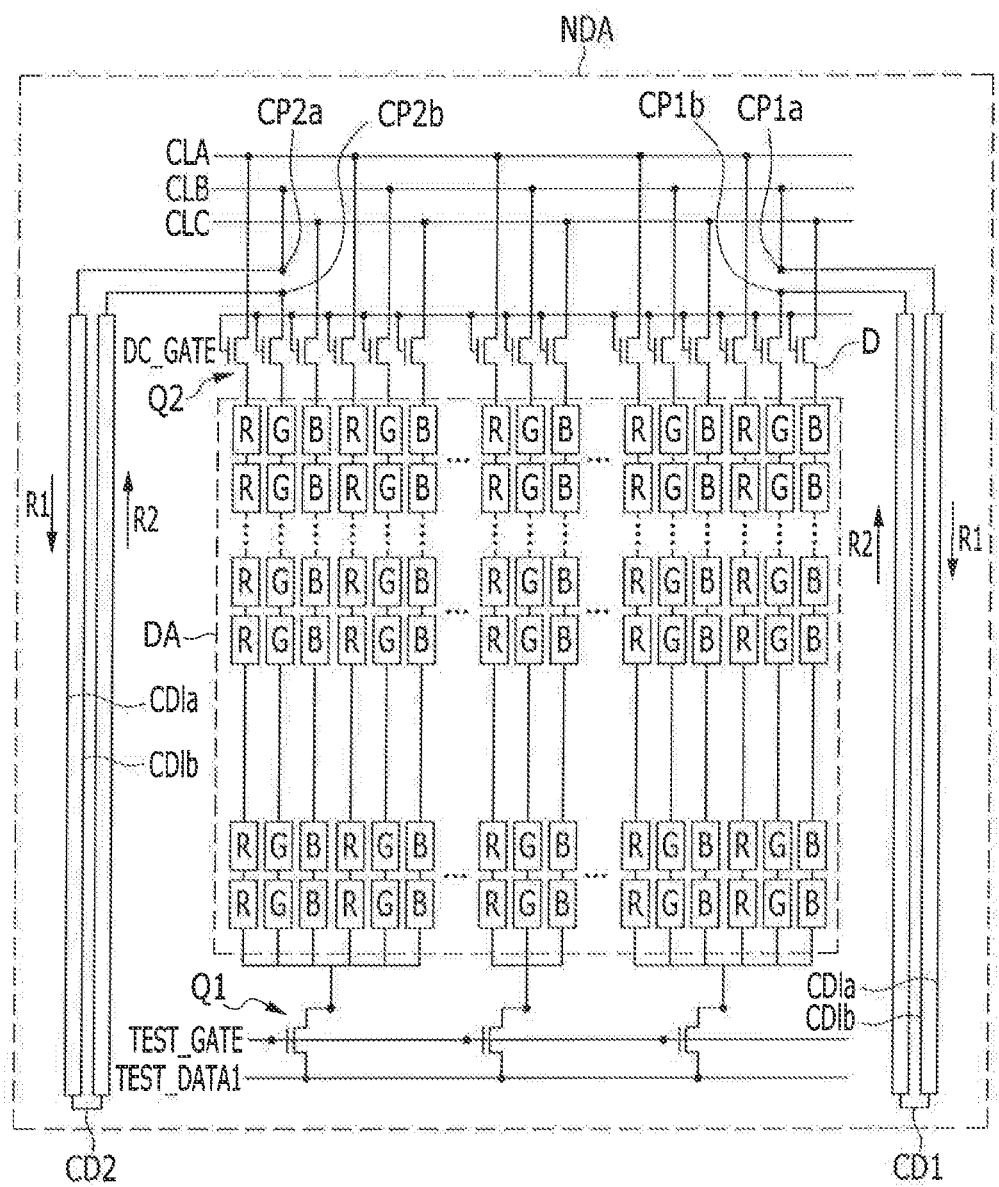
FIG. 7 is a layout view of the display device according to an exemplary embodiment.
Figure 8:
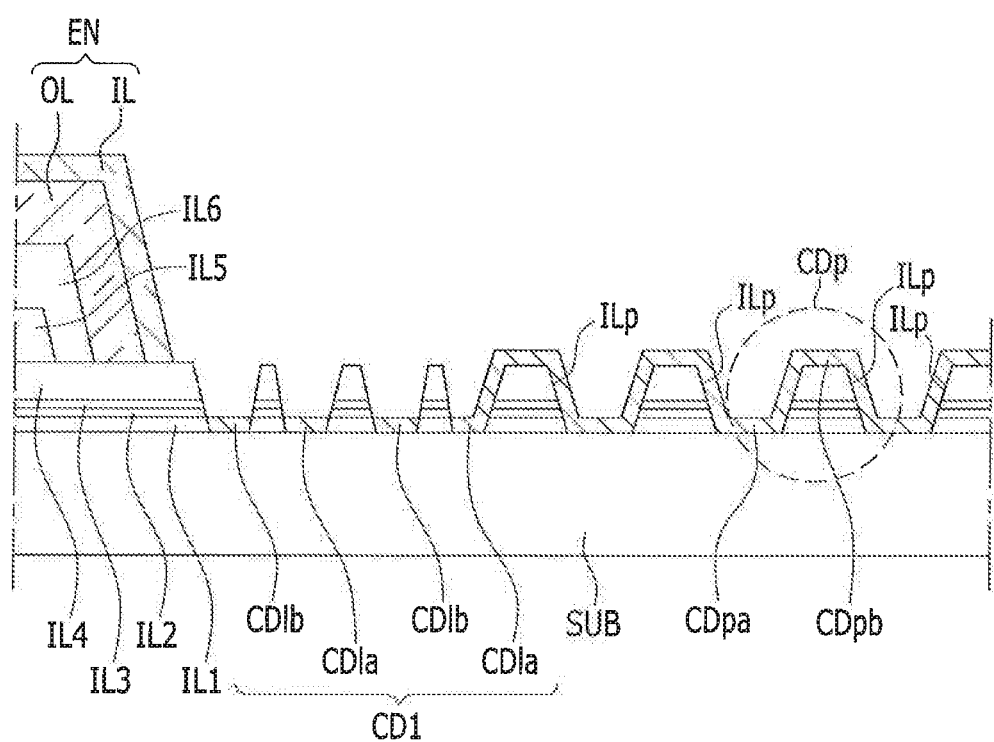
FIG. 8 is a cross-sectional view taken along line VIII-VIII of FIG. 6.

Hereinafter, a display device according to an exemplary embodiment of the present invention will be described with reference to FIGS. 6 to 8. The display device of an exemplary embodiment of the present invention will be described based on a difference from the display device of an aforementioned exemplary embodiment of the present invention, and descriptions of elements that may be assumed to be similar to those of an aforementioned exemplary embodiment of the present invention may be omitted.

Figure 6:
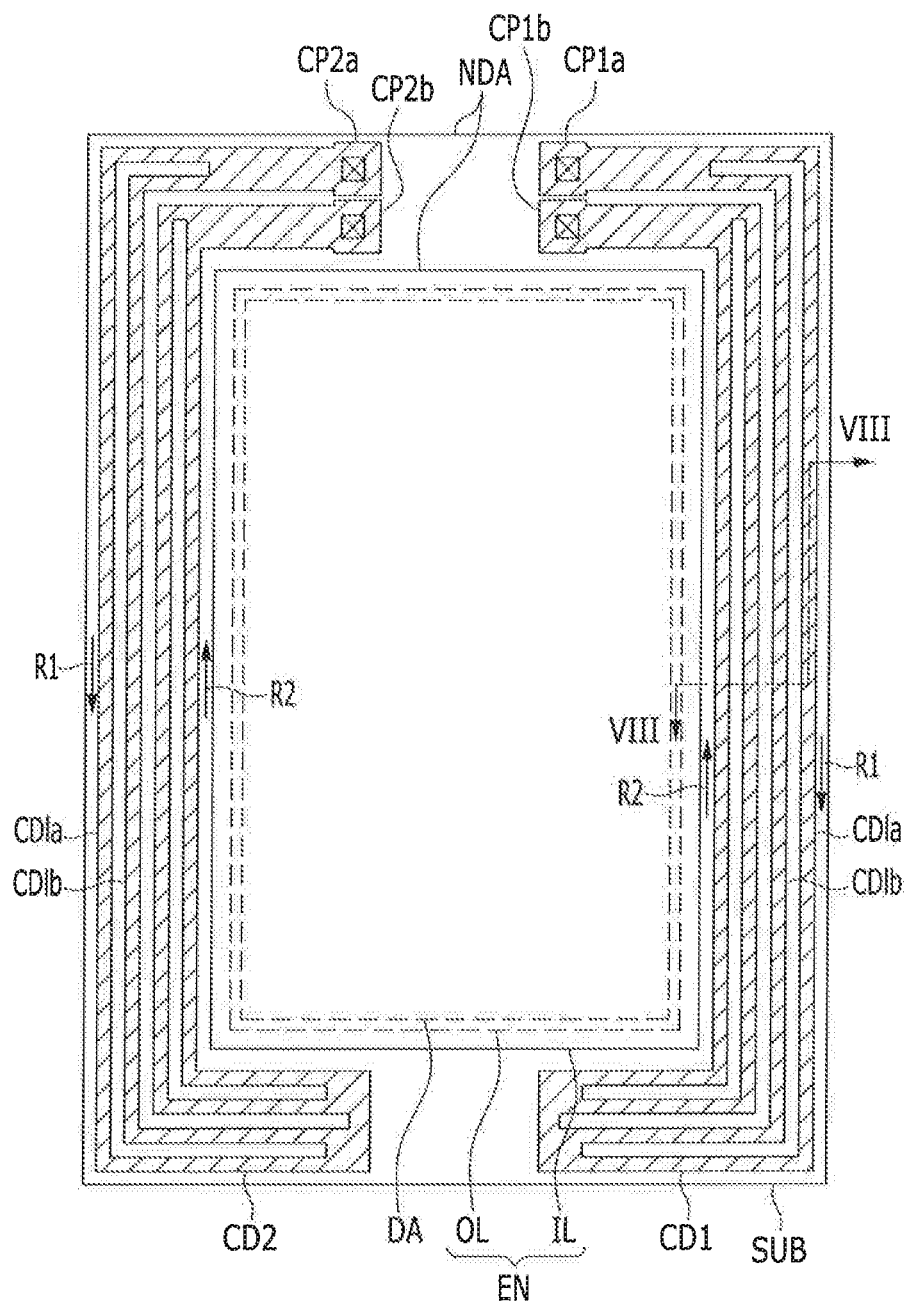
FIG. 6 is a top plan view schematically illustrating a disposition of a crack detection line in a display device according to an exemplary embodiment.

FIG. 6 is a top plan view schematically illustrating a disposition of a crack detection line in a display device according to an exemplary embodiment. FIG. 7 is a layout view of the display device according to an exemplary embodiment, and FIG. 8 is a cross-sectional view taken along line VIII-VIII of FIG. 6.

A first crack detection line CD1 and a second crack detection line CD2 are disposed at both sides of a display area DA, respectively, so as to at least partially surround the display area DA, in which the plurality of pixels R, G, and B is positioned.

The first crack detection line CD1 extends in a first direction R1 from a first connection portion CP1a along a non-display area NDA adjacent to a border of the display area DA, in which the plurality of pixels R, G, and B is formed The first crack detection line CD1 may be divided into a first line CD1a and a second line CD1b while extending in the first direction R1. A thickness of each of the first line CD1a and the second line CD1b may be smaller than that of the first crack detection line CD1, and a sum of the thicknesses of the first line CD1a and the second line CD1b may be substantially the same as a thickness of the first crack detection line CD1. The first line CD1a and the second line CD1b are joined again for the first crack detection line CD1 to change direction and return in a second direction R2 that is an opposite direction to the first direction R1. The first crack detection line CD1 is divided into the first line CD1a and the second line CD1b again while extending in the second direction R2. The first line CD1a and the second line CD1b of the first crack detection line CD1 are joined again near a second connection portion CP1b. However, exemplary embodiments of the present are not limited thereto. For example, the first crack detection line CD1 may include more lines than just a first line CD1a and a second line CD1b.

Similarly, the second crack detection line CD2 extends in the first direction R1 from a third connection portion CP2a along the non-display area NDA adjacent to the border of the display area DA, in which the plurality of pixels R, G, and B is formed The second crack detection line CD2 is divided into a first line CD1a and a second line CD1b again while extending in the first direction R1. A thickness of each of the first line CD1a and the second line CD1b may be smaller than that of the second crack detection line CD2, and a sum of the thicknesses of the first line CD1a and the second line CD1b may be substantially the same as a thickness of the second crack detection line CD2. The first line CD1a and the second line CD1b are joined again for the second crack detection line CD1 to change direction and return in the second direction R2 that is an opposite direction to the first direction R1. The second crack detection line CD2 is divided into the first line CD1a and the second line CD1b again while extending in the second direction R2. The first line CD1a and the second line CD1b of the second crack detection line CD2 are joined again near a fourth connection portion CP2b.

The first crack detection line CD1 includes a plurality of repeatedly positioned stepped wiring units CDp. The stepped wiring unit CDp includes a first portion CDpa and a second portion CDpb having a height difference. The stepped wiring unit CDp of the first crack detection line CD1 includes a second portion CDpb overlapping an insulative step portion ILp, and the first portion CDpa does not overlap an insulative step portion ILp. The insulative step portion ILp provides a step to the first crack detection line CD1, and a height of a surface of the first crack detection line CD1 is changed according to whether the first crack detection line CD1 overlaps the insulative step portion ILp. For example, the stepped wiring unit CDp has a step along a surface of the insulative step portion ILp. The second portion CDpb of the stepped wiring unit CDp is positioned on a surface of an upper portion of the insulative step portion ILp, and the first portion CDpa is positioned at substantially the same height as that of the lower portion of the insulative step portion ILp. The first portion CDpa and the second portion CDpb are connected along a lateral wall of the insulative step portion ILp. The first portion CDpa and the second portion CDpb have a height difference corresponding to a height of the insulative step portion ILp. For example, the second portion CDpb overlaps the insulative step portion ILp, and the first portion CDpa does not overlap the insulative step portion ILp. Accordingly, the first crack detection line CD1 has a form, in which the high second portion CDpb and the low first portion CDpa, which both form the height difference corresponding to the height of the insulative step portion ILp, are repeated in the extension direction of the first crack detection line CD1.

In addition, the second crack detection line CD2 may include a stepped wiring unit CDp including the first portion CDpa and the second portion CDpb having a height difference. Further, the forms of the first crack detection line CD1 and the second crack detection line CD2 may be substantially the same as each other.

As described above, when the first crack detection line CD1 and the second crack detection line CD2 are divided into the first line CD1a and the second line CD1b, each of which has a smaller thickness than that of the first crack detection line CD1, it is possible to detect a crack more effectively compared to a case where the crack detection line is formed of one non-divided wire. In the case where the crack detection line is formed of one non-divided wire, when a crack is generated at a part of the crack detection line and a current flows through a portion of the crack detection line, which is not damaged, it may be difficult to detect a damage of the crack detection line. However, in the case where the first crack detection line CD1 and the second crack detection line CD2 are divided into the first line CD1a and the second line CD1b, each of which has a smaller thickness than that of the first crack detection line CD1, even though a crack is generated only at a part of the crack detection line, it may be difficult for a current to flow through a portion that is not damaged. Accordingly, it may be possible to detect damage to a part of the crack detection line.

Many of the characteristics of the display devices according to an exemplary embodiment of the present invention described with reference to FIGS. 1 to 5 may be applied to an exemplary embodiment of the present invention described hereinafter.

Hereinafter, a display device according to an exemplary embodiment of the present invention will be described with reference to FIG. 9. The display device of an exemplary embodiment of the present invention will be described based on a difference from the display device of an aforementioned exemplary embodiment of the present invention, and descriptions of elements that may be assumed to be similar to those of an aforementioned exemplary embodiment of the present invention may be omitted.

Figure 9:
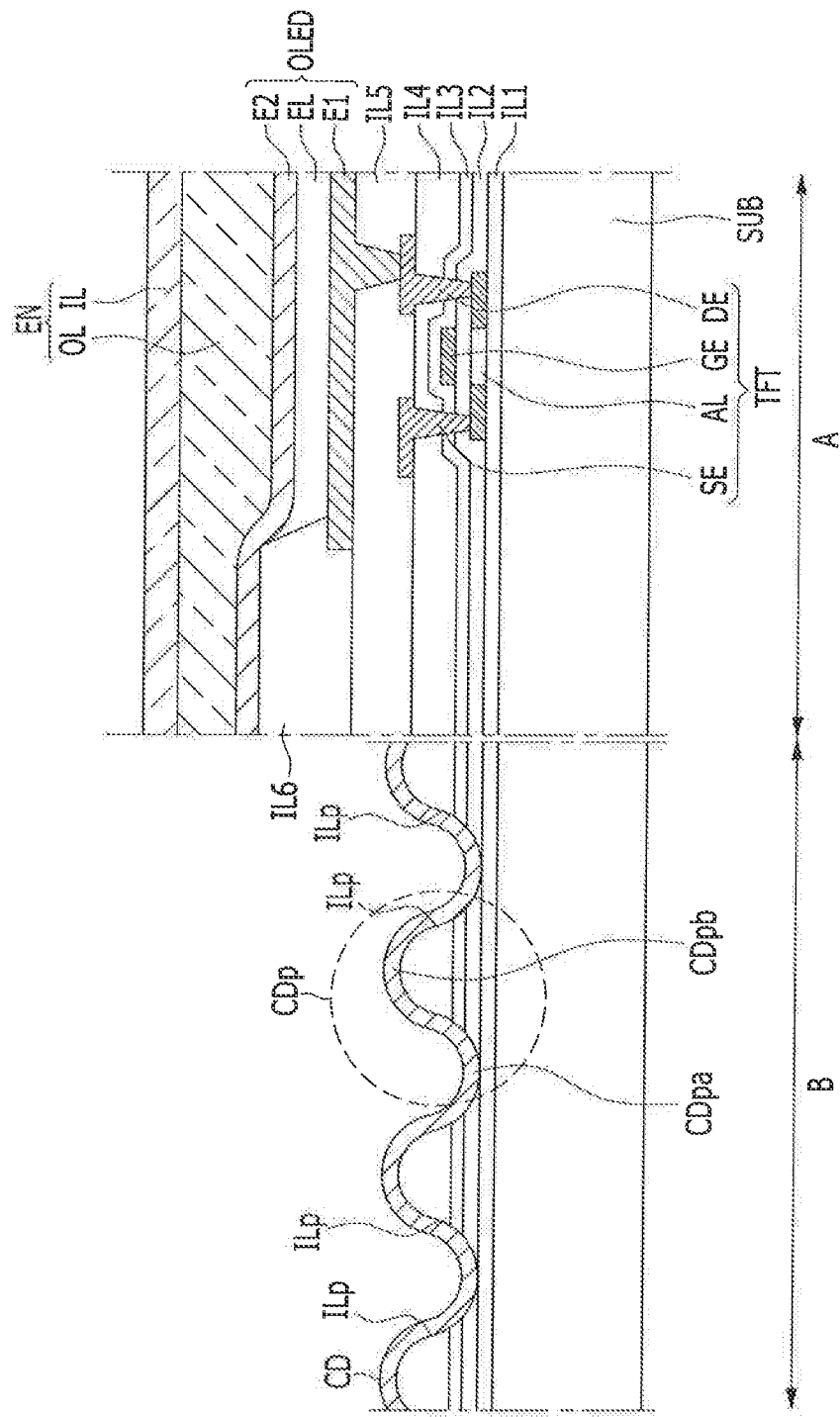
FIG. 9 is a schematic cross-sectional view of a display device according to an exemplary embodiment.

FIG. 9 is a schematic cross-sectional view of a display device according to an exemplary embodiment. A first area A of FIG. 9 represents a cross-section of a part of one pixel in the display area of the display device. A second region B of FIG. 9 represents a cross-section of a portion of the non-display area of the display device, through which a crack detection line CD passes, taken along in a direction extending along an extension direction of the crack detection line CD.

The crack detection line CD includes a plurality of repeatedly positioned stepped wiring units CDp. The stepped wiring unit CDp includes a first portion CDpa and a second portion CDpb having a height difference, and the first portion CDpa and the second portion CDpb may be connected in a form of a curve which is not angulated. The crack detection line CD has a form, in which the first portion CDpa and the second portion CDpb are repeatedly present in an extension direction of the crack detection line CD, so that a predetermined height difference is repeated.

The stepped wiring unit CDp of the crack detection line CD includes the second portion CDpb overlapping an insulative step portion ILp and the first portion CDpa, which does not overlap the insulative step portion ILp. For example, the insulative step portion ILp may be positioned under a part of the stepped wiring unit CDp, and a surface of the insulative step portion ILP may be curved. The insulative step portion ILp provides a step to a first crack detection line CD1, and a height of a surface of the first crack detection line CD1 is changed according to whether the first crack detection line CD1 overlaps the insulative step portion ILp. For example, the stepped wiring unit CDp has a step along a surface of the insulative step portion ILp. The plurality of insulative step portions ILp is repeatedly disposed in the extension direction of the first crack detection line CL1 with a predetermined interval. The plurality of insulative step portions ILp may include at least a part of sequentially disposed second to fourth insulating layers IL2, IL3, and IL4.

The second portion CDpb of the crack detection line CD may be positioned on substantially the same layer as that of a source electrode SE, and the first portion CDpa of the crack detection line CD may be positioned on substantially the same layer as an active layer AL.

A lot of characteristics of the display devices according to exemplary embodiments of the present invention described with reference to FIGS. 1 to 5, and FIGS. 6 to 8 may be applied to other exemplary embodiments of the present invention.

According to the display device according to aforementioned exemplary embodiments of the present invention, it may be described that the display device includes the encapsulating unit, but the display device according to an exemplary embodiment of the present invention is not limited thereto. Further, the form and the height of the insulative step portion ILp may be various, and correspondingly, the form of the crack detection line CD and a height difference between the first portion CDpa and the second portion CDpb may also be various. For example, the second portion CDpb may be positioned on the same layer as that of the source electrode SE and the first portion CDpa may be positioned on the same layer as that of the gate electrode GE. In addition, the second portion CDpb may be positioned on the same layer as that of the gate electrode GE and the first portion CDpa may be positioned on the same layer as the active layer AL. Further, the forms (e.g., shape) and the heights of the plurality of insulative step portion ILps may be different from one another.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. A display device, comprising:
a substrate including a display area and a non-display area;
a plurality of pixels in the display area of the substrate;
a plurality of gate lines and a plurality of data lines respectively connected to the plurality of pixels;
a plurality of first regions disposed in the non-display area of the substrate and arranged in a first direction repeatedly to sides of the display area; and
a crack detection line in the non-display area and extending primarily in the first direction,
wherein the crack detection line includes a first portion which does not overlap the plurality of first regions, and a second portion overlapping each of the first regions,
each of the plurality of first regions comprises at least one insulating layer, and
the first portion of the crack detection line is not electrically connected to any elements.

2. The display device of claim 1, wherein the crack detection line is not in the display area.

3. A display device, comprising:
a substrate including a display area and a non-display area;
a plurality of pixels in the display area of the substrate;
a plurality of gate lines and a plurality of data lines respectively connected to the plurality of pixels;
a plurality of first regions disposed in the non-display area of the substrate and arranged in a first direction repeatedly to sides of the display area; and
a crack detection line in the non-display area and extending primarily in the first direction,
wherein the crack detection line includes a first portion which does not overlap the plurality of first regions, and a second portion overlapping each of the first regions,
wherein
the first portion and the second portion of the crack detection line are at different heights from each other,
wherein
the second portion of the crack detection line is on a surface of an upper portion of a first region of the plurality of first regions,
wherein the first portion of the crack detection line is at substantially the same height as that of a lower portion of the first region of the plurality of first regions, and
wherein the first portion of the crack detection line is not electrically connected to any elements.

4. The display device of claim 3, wherein
the crack detection line is connected to at least one data line of the plurality of data lines.

5. The display device of claim 4, wherein
the crack detection line at least partially surrounds the display area of the substrate.

6. The display device of claim 5, wherein
the plurality of first regions includes an organic material or an inorganic material, and at least partially surrounds the display area of the substrate.

7. The display device of claim 4, wherein
the second portion is on substantially the same layer as that of the data line, and
the crack detection line includes substantially the same material as that of the data line.

8. The display device of claim 7; wherein
the first portion is directly on the substrate.

9. The display device of claim 7, further comprising an insulating layer on the substrate, wherein the first portion is on the insulating layer.

10. The display device of claim 7, further comprising:
an active layer connected with the data line,
wherein the first portion is at substantially the same height as that of the active layer.

11. The display device of claim 4, wherein
the plurality of first regions have substantially the same form.

12. The display device of claim 4, wherein
a part of the crack detection line is divided into a first line and a second line.

13. A display device, comprising:
a substrate including a display area and a non-display area;
a plurality of pixels in the display area of the substrate;
a plurality of gate lines and a plurality of data lines respectively connected to the plurality of pixels;
a plurality of first regions disposed in the non-display area of the substrate and arranged in a first direction repeatedly to sides of the display area; and
a crack detection line in the non-display area and extending primarily in the first direction,
wherein the crack detection line includes a first portion which does not overlap the plurality of first regions, and a second portion overlapping each of the first regions
wherein
the first portion and the second portion of the crack detection line are at different heights from each other, and wherein
the second portion of the crack detection line is on a surface of an upper portion of a first region of the plurality of first regions, and
the first portion of the crack detection line is at substantially the same height as that of a lower portion of the first region of the plurality of first regions, wherein
the crack detection line is connected to at least one data line of the plurality of data lines,
a part of the crack detection line is divided into a first line and a second line, and
a sum of thicknesses of the first line and the second line is equal to or smaller than a thickness of the crack detection line.

14. A display device, comprising:
a substrate including a first area and a second area surrounding the first area;
a plurality of first regions disposed in the second area of the substrate and arranged in a first direction repeatedly to a side of the first area;
a crack detection line in the second area and extending primarily in the first direction,
wherein the crack detection line includes a first portion and a second portion, wherein the first portion is between each first region of the plurality of first regions, and the second portion overlaps each of the first regions, and wherein the crack detection line is divided into a plurality of lines.

15. The display device of claim 14, wherein the plurality of lines recombines near a first end and a second end of the crack detection line.

16. The display device of claim 14, wherein the first portion is on the substrate, and the first portion and the second portion are at different heights from each other.

17. The display device of claim 16, wherein the first portion and the second portion are connected to each other along a lateral wall of each first region of the plurality of first regions.

18. A display device, comprising:
a substrate including a display area and a non-display area surrounding the display area;
a plurality of first regions disposed in the non-display area and arranged in a first direction repeatedly to a side of the display area with a predetermined interval;
a first insulating layer disposed on the substrate; and
a crack detection line on the plurality of first regions;
wherein the crack detection line includes a first portion and a second portion, wherein the second portion overlaps an upper portion of a first region of the plurality of first regions and the first portion is adjacent to at least one first region of the plurality of first regions,
and
wherein a bottom surface of the first portion of the crack detection line directly contacts only the first insulating layer without electrically connecting to any elements.

19. The display device of claim 18, wherein the first portion and second portion have a curvature.

20. The display device of claim 18, wherein the first portion is on the substrate.

21. A display device, comprising:
a substrate including a display area and a non-display area surrounding the display area;
a plurality of first regions disposed in the non-display area and arranged in a first direction repeatedly to a side of the display area with a predetermined interval;
a first insulating layer disposed on the substrate; and
a crack detection line on the plurality of first regions;
wherein the crack detection line includes a first portion and a second portion,
wherein the second portion overlaps an upper portion of a first region of the plurality of first regions and the first portion is adjacent to at least one first region of the plurality of first regions,
wherein a bottom surface of the first portion of the crack detection line directly contacts the first insulating layer, and
wherein the crack detection line has a serpentine pattern winding up and down in a direction perpendicular to a plane of the substrate.

22. The display device of claim 1, wherein the each of the plurality of first regions comprises at least two or more insulating layers.

* * * * *